(12) United States Patent
Chen et al.

(10) Patent No.: US 7,902,749 B2
(45) Date of Patent: Mar. 8, 2011

(54) ORGANIC ELECTROLUMINESCENCE PIXEL, ORGANIC ELECTROLUMINESCENCE DEVICE, AND MANUFACTURING METHOD THEREOF

(75) Inventors: Chieh-Wei Chen, Hsinchu (TW); Yao Chang Wang, Hsinchu (TW); Shi-Hao Li, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 813 days.

(21) Appl. No.: 11/838,987

(22) Filed: Aug. 15, 2007

(65) Prior Publication Data

US 2008/0272991 A1    Nov. 6, 2008

(30) Foreign Application Priority Data

May 2, 2007   (TW) ............................... 96115627 A

(51) Int. Cl.
*H01J 1/62*   (2006.01)

(52) U.S. Cl. ........................................ 313/506; 313/504
(58) Field of Classification Search .................. 313/498, 313/504, 506
See application file for complete search history.

(56) References Cited

U.S. PATENT DOCUMENTS

2006/0158098 A1   7/2006 Raychaudhuri et al.

*Primary Examiner* — Vip Patel
(74) *Attorney, Agent, or Firm* — Thomas, Kayden, Horstemeyer & Risley, LLP

(57) ABSTRACT

An organic electroluminescence pixel, an organic electroluminescence device comprising the same, and method for manufacturing the organic electroluminescence device are provided. The organic electroluminescence pixel comprises a substrate, a first electrode, a first carrier-injection layer, a semi-trans-flective metal layer, an organic emitting layer, and a second electrode. The first electrode is formed on the substrate. The first carrier-injection layer, the semi-trans-flective metal layer, and the organic emitting layer are formed between the first electrode and the second electrode. At least one of the first electrode and the second electrode comprises a transparent electrode.

21 Claims, 4 Drawing Sheets

ORGANIC ELECTROLUMINESCENCE PIXEL, ORGANIC ELECTROLUMINESCENCE DEVICE, AND MANUFACTURING METHOD THEREOF

This application claims the benefit of priority based on Taiwan Patent Application No. 096115627, filed on May 2, 2007, the contents of which are incorporated herein by reference in their entirety.

CROSS-REFERENCES TO RELATED APPLICATIONS

Not applicable.

BACKGROUND OF THE INVENTION

1. Field of the Invention

The present invention relates to an organic electroluminescence (OEL) pixel with high color saturation and high luminescent efficiency, an organic electroluminescence device comprising OEL pixels, and a manufacturing method thereof.

2. Descriptions of the Related Art

With the advantages of self-emission, high luminescent efficiency, high contrast ratio, and ultra wide viewing angle, the organic electroluminescence display (OELD) is increasingly becoming a focus of research in the electronic display field. The OELD can be divided into two categories: the active matrix organic electroluminescence display (AMOELD) and the passive matrix organic electroluminescence display (PMOELD).

Since the OELD technology eliminates the need of backlit modules and features self-emission capability, higher contrast ratio, lower power consumption, wider viewing, slimmer thickness as well as a higher response speed compared to liquid crystal display (LCD) technology, it is better suited for electronic products for future generations. It is therefore considered as one of the most promising display technologies of the future.

As shown in FIG. 1, an OEL device 1 in a conventional AMOELD comprises a plurality of OEL pixels 1r, 1g, 1b, a substrate 11, an active matrix circuitry layer 12, a plurality of transparent lower electrodes 13r, 13g, 13b, a pixel insulation layer 15, an organic emitting layer 17, and an upper electrode 19. The OEL pixels 1r, 1g, 1b are configured to emit red light, green light, and blue light, respectively. The substrate 11 further comprises a plurality of thin film transistors (TFTs) 111, 113, 115 and a plurality of signal lines 116. The TFT 111 is configured to control the OEL pixel 1r in the OEL device 1 to emit red light, the TFT 113 is configured to control the OEL pixel 1g in the OEL device 1 to emit green light, and the TFT 115 is configured to control the OEL pixel 1b in the OEL device 1 to emit blue light. The pixel insulation layer 15 is configured to define the emitting area of respective OEL pixels 1r, 1g, 1b. The signal lines 116 are configured to transfer signals.

In order for the aforesaid OEL device 1 to emit red light, the TFT 111 is turned on to energize the lower electrode 13r, thus allowing the OEL pixel 1r to emit red light. At the same time, the TFTs 113 and 115 are turned off, so as not to allow the OEL pixels 1g and 1b to emit light. As a result, the OEL device 1 only emits red light.

However, in this type of conventional bottom-emission AMOELD, constraints imposed by the materials used often leads to insufficient color saturation in the OEL device 1. Therefore, in the conventional technologies, microcavity structures are further fabricated to improve the luminescent efficiency and color saturation of the OEL pixels 1r, 1g, 1b. As shown in FIG. 2, the OEL device 2 is similar to the OEL device 1 in most of its structure, and comprises a plurality of OEL pixels 2r, 2g, 2b, a substrate 21, an active matrix circuitry layer 22, a plurality of transparent lower electrodes 23r, 23g, 23b, a pixel insulation layer 25, an organic emitting layer 27, and an upper electrode 29. The OEL pixels 2r, 2g, 2b are configured to emit red light, green light, and blue light, respectively. The substrate 21 further comprises a plurality of TFTs 211, 213, 215 and a plurality of signal lines 216.

In conventional technology as shown in FIG. 2, in order to fabricate OELDs with microcavity structures, a photo-etching process is utilized to form patterned semi-trans-flective metal electrodes 24r, 24g, 24b on the transparent lower electrodes 23r, 23g, 23b. The pixel insulation layer 25 is then formed thereon to define an emitting area for the pixel. However, this requires an additional photo-etching process in the existing TFT process, which adds to the manufacturing costs. Moreover, surfaces of the semi-trans-flective metal electrodes exposed in the photo-etching process may suffer from at least one of oxidation, increased surface roughness, residue of conductive substances, and/or residue from organic substances, all which will have adverse effect on the properties of the device (e.g., incurrence of short circuits, variation of electrical property, and variation of operation voltage).

In addition to the need of forming patterned semi-trans-flective metal electrodes on the transparent lower electrodes 23r, 23g, 23b, the microcavity structure described above also requires an organic film layer with appropriate thickness in the OEL device 2. The thickness of the organic film layer must be selected appropriately in order to improve the color saturation and luminescence efficiency of the OEL device 2. A thinner organic film layer (i.e. the organic emitting layer 27) will undoubtedly endow the OEL device 2 with better luminescent efficiency and color saturation. However, due to the uneven surface of the transparent lower electrodes 23r, 23g, 23b and/or the semi-trans-flective metal electrodes 24r, 24g, 24b (e.g., protrusions on the semi-trans-flective metal electrodes 24g in FIG. 2), an unduly thin organic film layer tends to cause a current leakage or even a short circuit between the upper electrodes 29 and the transparent lower electrodes 23r, 23g, 23b or the upper electrodes 29 and the semi-trans-flective metal electrodes 24r, 24g, 24b in the OEL device 2. On the other hand, if the organic film layer has its thickness increased in order to eliminate the aforesaid current leakage phenomenon in the OEL device 2, variation of its luminescent efficiency and color saturation will be increased due to an uneven thickness of the organic film layer.

Accordingly, an effort still has to be made in this field to enhance the luminescent efficiency and color saturation of the OEL devices in OELDs without introducing any additional process, and without modifying the existing manufacturing process and yield thereof.

SUMMARY OF THE INVENTION

One of the objectives of this invention is to provide an organic electroluminescence pixel, which comprises a substrate, a first electrode, a first carrier-injection layer (CIL), a semi-trans-flective metal layer, a first organic emitting layer, and a second electrode. The first electrode is formed on the substrate. The first CIL, the semi-trans-flective metal layer, and the first organic emitting layer are formed between the first electrode and the second electrode. At least one of the first electrode and the second electrode comprises a transparent electrode.

Another objective of this invention is to provide an OEL device, which comprises a plurality of OEL pixels electrically connected with each other. At least one of the OEL pixels is the OEL pixel defined above.

Yet a further objective of this invention is to provide a method for manufacturing an OEL device. The method comprises: providing a substrate; forming a first electrode on the substrate; forming a first pixel on the first electrode; and forming a second electrode on the first pixel. The step of forming a first electrode on the substrate further comprises the steps of: forming a first CIL; forming a semi-trans-flective metal layer; and forming an organic emitting layer. At least one of the first electrode and the second electrode comprises a transparent electrode.

As a result, this invention can improve the luminescent efficiency and the color saturation of OEL devices and effectively mitigate the current leakage therein without introducing any additional manufacturing process or modifying the existing manufacturing process and yield thereof.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
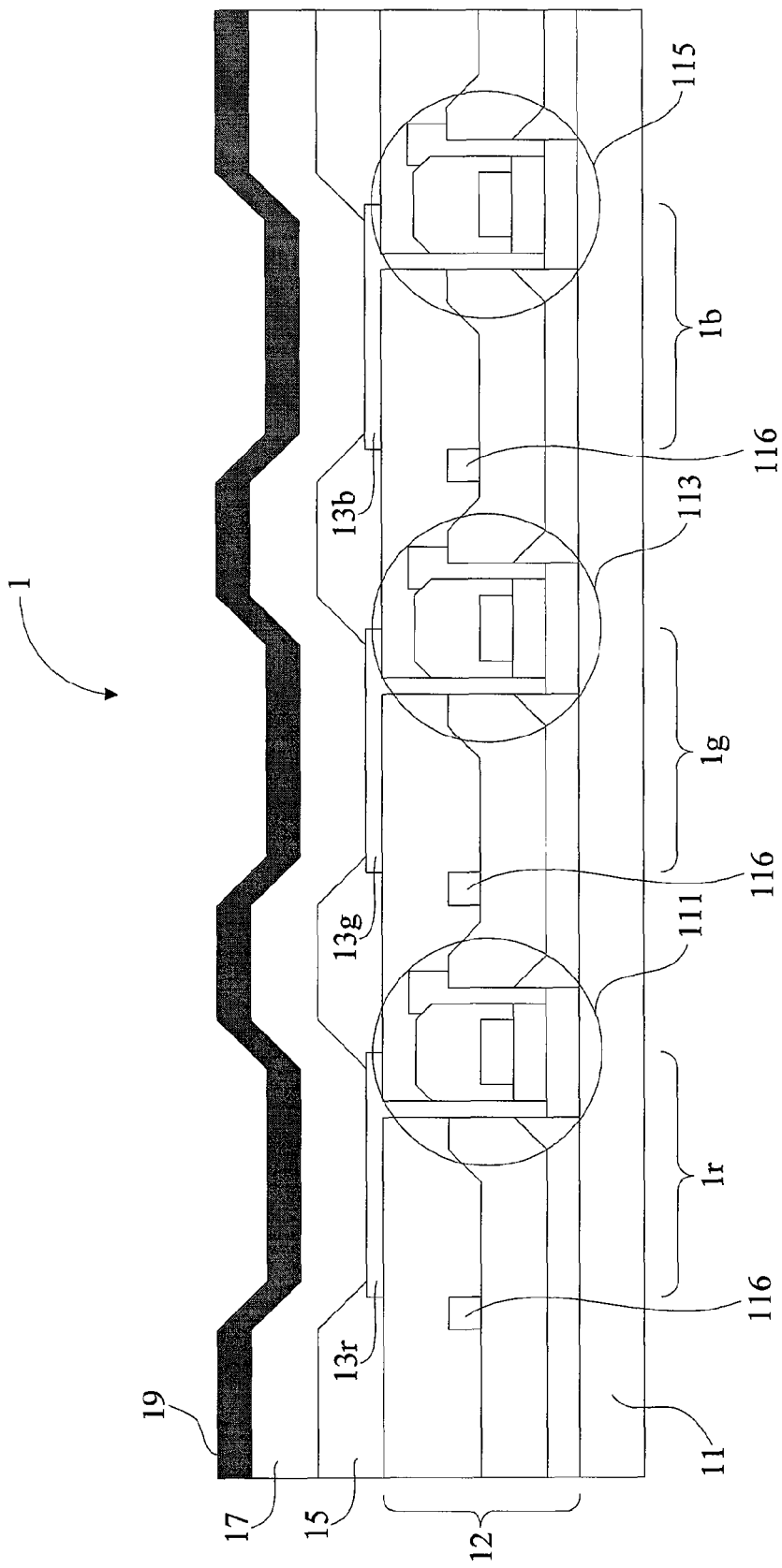
FIG. 1 is a schematic diagram illustrating a conventional OEL device.
Figure 2:
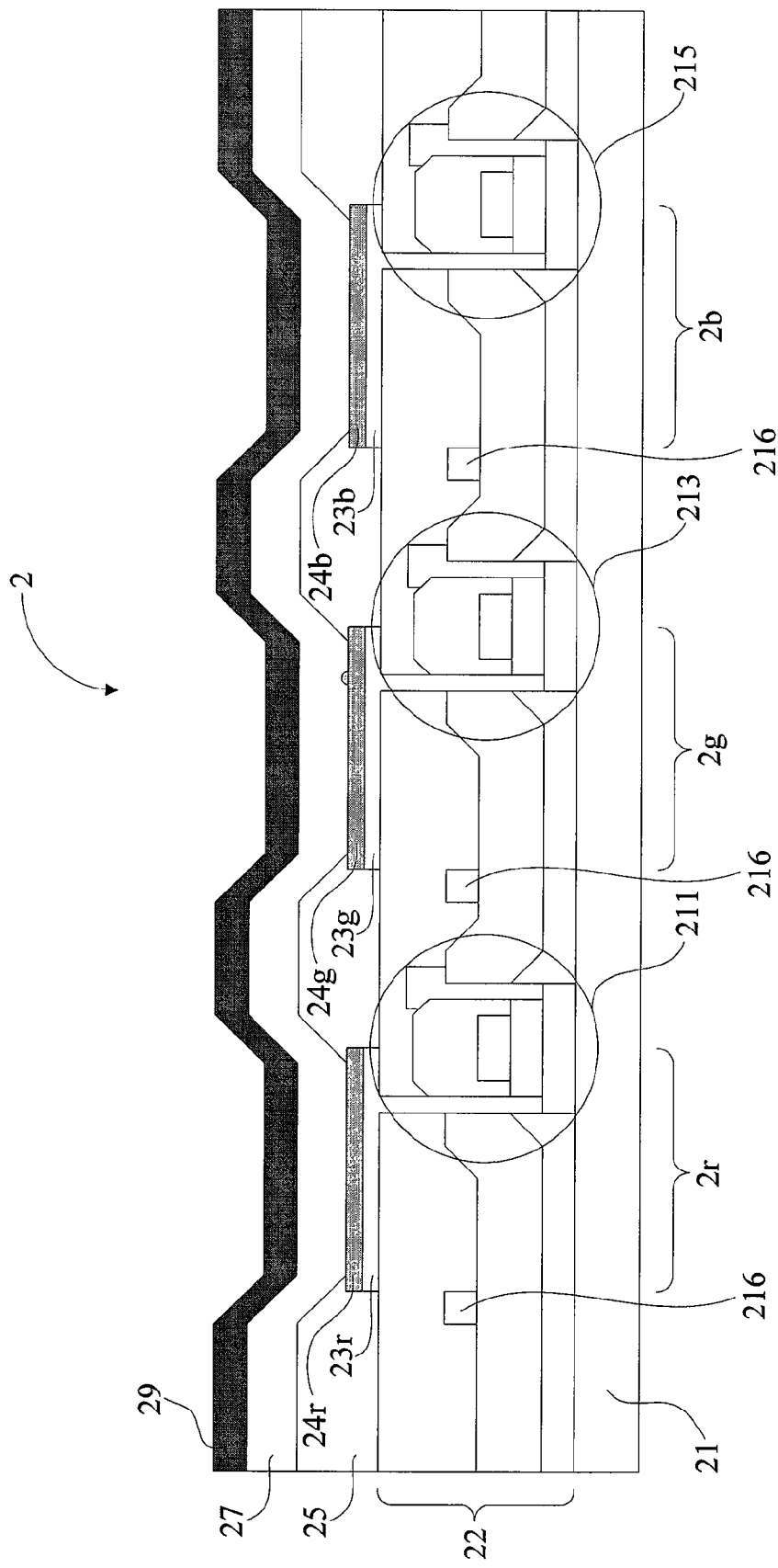
FIG. 2 is a schematic diagram illustrating another conventional OEL device.
Figure 3:
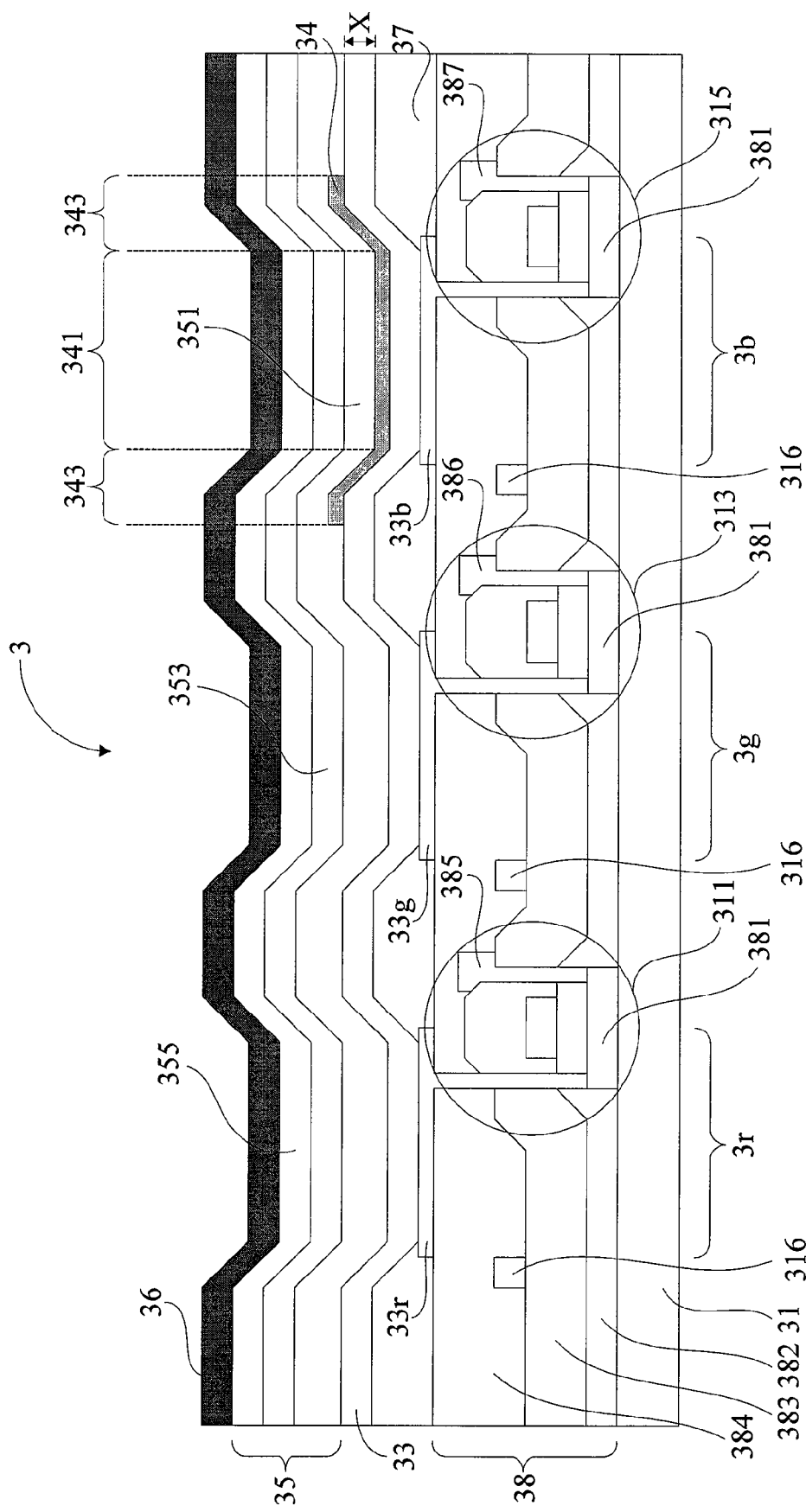
FIG. 3 is a schematic diagram illustrating the first embodiment of this invention.

As shown in FIG. 3, the first embodiment of the present invention is an organic electroluminescence (OEL) device 3. The OEL device 3 may be (but is not limited to) a bottom emitting type, a top emitting type, a dual emitting type, or a combination thereof. In this embodiment, the OEL device 3 is the bottom emitting type, and will be used as an example for the following description.

The OEL device 3 comprises a plurality of OEL pixels 3$r$, 3$g$, 3$b$, a substrate 31, a plurality of first electrodes 33$r$, 33$g$, 33$b$, a first carrier-injection layer (CIL) 33, a semi-trans-flective metal layer 34, an organic emitting layer 35, a second electrode 36, an insulation layer 37, and an active matrix circuitry layer 38. The OEL pixels 3$r$, 3$g$, 3$b$ are configured to emit red light, green light, and blue light, respectively. The active matrix circuitry layer 38 further comprises an active matrix layer 381, a gate dielectric layer 382, an interlayer dielectric layer 383, a passivation layer 384, a plurality of TFTs 311, 313, 315, a plurality of signal lines 316, and a plurality of line segments 385, 386, 387 electrically connected to their respective signal lines. The types of the TFTs include a top-gate type, a bottom-gate type, other similar types, or a combination thereof. The TFTs of various types all include an active layer 381 therein, that comprises Si-containing amorphous materials, Si-containing single crystalline materials, Si-containing microcrystalline materials, Si-containing polycrystalline materials, Ge-containing amorphous materials, Ge-containing single crystalline materials, Ge-containing microcrystalline materials, Ge-containing polycrystalline materials, other similar materials, or a combination thereof. In this embodiment, a top-gate type of TFT is made of Si-containing polycrystalline materials (e.g., polycrystalline silicon) is used as an example, and this invention is not limited thereto. The TFTs 311, 313, 315 are configured to control the OEL pixels 3$r$, 3$g$, 3$b$ of the OEL device 3 to emit red light, green light, and blue light, respectively. The signal lines 385, 386, 387 are configured to supply signals (e.g., signal levels) to the TFTs 311, 313, 315, respectively. The first CIL 33, the semi-trans-flective metal layer 34, and the organic emitting layer 35 are formed between the first electrodes 33$r$, 33$g$, 33$b$ and the second electrodes 36.

In the OEL device 3, at least one of the first electrodes 33$r$, 33$g$, 33$b$ and the second electrode 36 is a transparent electrode, a reflective electrode, or a combination thereof (e.g., a partly transparent and partly reflective electrode). In this embodiment, since the OEL device 3 is a bottom-emitting type, the first electrodes 33$r$, 33$g$, 33$b$ are made of a transparent material which renders them transparent. The transparent material includes indium tin oxide (ITO), indium zinc oxide (IZO), aluminum zinc oxide (AZO), aluminum tin oxide (ATO), cadmium tin oxide (CTO), hafnium oxide (HfO), other similar materials, or a combination thereof. The second electrode 36 is made of a reflective material which renders it non-transparent. The reflective material may includes Au, Ag, Cu, Fe, Tin, Al, Ti, Ta, Mo, W, Nd, Hf, Li, Mg, Ca, alloys thereof, nitrides thereof, oxides thereof, or a combination of the above materials.

On the contrary, if the OEL device 3 is a top emitting type, the first electrodes 33$r$, 33$g$, 33$b$ may be made of a reflective material which renders them non-transparent. The reflective material includes Au, Ag, Cu, Fe, Tin, Al, Ti, Ta, Mo, W, Nd, Hf, Li, Mg, Ca, alloys thereof, nitrides thereof, oxides thereof, or a combination of the above materials. The second electrode 36 may be made of a transparent material which renders it transparent. The transparent material may include ITO, IZO, AZO, ATO, CTO, HfO, other similar materials, or a combination thereof. Alternatively, if the OEL device 3 is a dual emitting type, both the first electrodes 33$r$, 33$g$, 33$b$ and the second electrode 36 are made of a transparent material, including ITO, IZO, AZO, ATO, CTO, HfO, other similar materials, or a combination thereof. Even further, if the OEL 3 is a combination of two of the top emitting type, the bottom emitting type, and the dual emitting type, the material for making at least one of the first electrodes 32$r$, 32$g$, 32$b$ and the second electrode 36 comprises at least one of the transparent materials and the reflective materials described above.

Although the first CIL 33 is formed on the first electrodes 33$r$, 33$g$, 33$b$ in the OEL device 3 of the first embodiment, it is not limited in that the first CIL 33 must be formed on all of the first electrodes 33$r$, 33$g$, 33$b$; instead, it can be formed on only at least one of the first electrodes 33$r$, 33$g$, 33$b$. Also, the thickness X of the first CIL 33 can be adjusted on each first electrode respectively in an attempt to obtain the optimum luminescent efficiency of respective OEL pixels 3$r$, 3$g$, 3$b$. In other words, depending on the design requirements, the first CIL 33 may have the same or different thickness on different pixels.

The organic emitting layer 35 further comprises a second CIL 351, a carrier transport layer (CTL) 353, and a light emitting layer 355, which constitutes the basic structure that forms a microcavity structure. In this embodiment, the CTL 353 is formed on the second CIL 351. The light emitting layer 355 is formed on the CTL 353, and comprises a metal complex compound, such as Al complex oxides and Bi complex oxides. The metal complex compounds may include organic materials, inorganic materials, or a combination thereof.

However, the organic emitting layer 35 in this invention is not limited to the aforesaid combination that forms the microcavity structure, and may have additional layers as desired. In this embodiment, the combination that forms the microcavity structure comprises the following ordered sequence: the light emitting layer 355/the CTL 353/the second CIL 351. Additionally, layers may be in other ordered sequences; for example, a multilayer structure may be (but is not limited) in the following ordered sequences: the CTL 353/the light emitting layer 355/the second CIL 351, the second CIL 351/the CTL 353/the light emitting layer 355, or the light emitting layer 355/the second CIL 351/the CTL 353.

The semi-trans-flective metal layer 34 is formed between the first CIL 33 and the first electrodes 33r, 33g, 33b. In this embodiment, in order to improve the color saturation and luminescent efficiency of the OEL pixel 3b that emits blue light in the OEL device 3, the semi-trans-flective metal layer 34 is formed only between first CIL 33 and the first electrode 33b, and is fabricated in the following way without addition of any shadow masking process: a photomask with a particular design is employed in conjunction with a particular evaporation deposition angle to make the semi-trans-flective metal layer 34 only deposit on, and entirely overcoat, the area of the OEL pixel 3b that emits blue light, but not on the OEL pixels 3r, 3g that emit red and green light. In other words, the semi-trans-flective metal layers 34 in adjacent OEL pixels are not connected to each other. However, the formation of the semi-trans-flective metal layer 34 is not limited to the OEL 3b that emits blue light, and instead, it can be formed on at least one of the OEL pixels 3r, 3g, 3b. Also, the semi-trans-flective metal layer 34 formed on at least one of the OEL pixels 3r, 3g, 3b may have the same or different thickness. Light reflectivity and transmissivity of the semi-trans-flective metal layer 34 depend on its thickness. The thicker the layer is, the higher its reflectivity will be. In contrast, the thinner it is, the higher its transmissivity will be. In this sense, whether an OEL pixel reflects or transmits light can be judged through its thickness. However, sometimes its resistance does not comply with the constraints for driving the OEL pixel, even if its thickness does. Therefore, whether an individual OEL pixel reflects or transmits light can be preferably judged by both its thickness and resistance.

To ensure the high luminescent efficiency of the OEL device 3 with the semi-trans-flective metal layer 34, a boundary has to be defined for the emitting area of the OEL device 3. The insulation layer 37 is used to define a pixel range area 341 from the semi-trans-flective layer 34. A lateral dimension of the pixel range area 341 is substantially smaller than that (not shown) of the semi-trans-flective metal layer 34. Located outside of the pixel range area 341 of the semi-trans-flective metal layer 34 are the boundary areas 343. Also, to ensure the high luminescent efficiency of the OEL device 3, a maximum brightness of the boundary areas 343 from outside of the pixel range area 341 to the boundary of the semi-trans-flective metal layer 34 should be substantially smaller than or substantially equal to 50% of that of the pixel range area 341.

Formation of the semi-trans-flective metal layer 34 in this invention is not limited to the position between the first CIL 33 and the first electrodes 33r, 33g, 33b. Instead, it can be formed inside the first CIL 33, between the first CIL 33 and the second CIL 351, inside the second CIL 351, between the second CIL 351 and the CTL 353, inside or on the CTL 353, all of which can be effective in improving the color saturation and luminescent efficiency of the OEL device 3.

Figure 4:
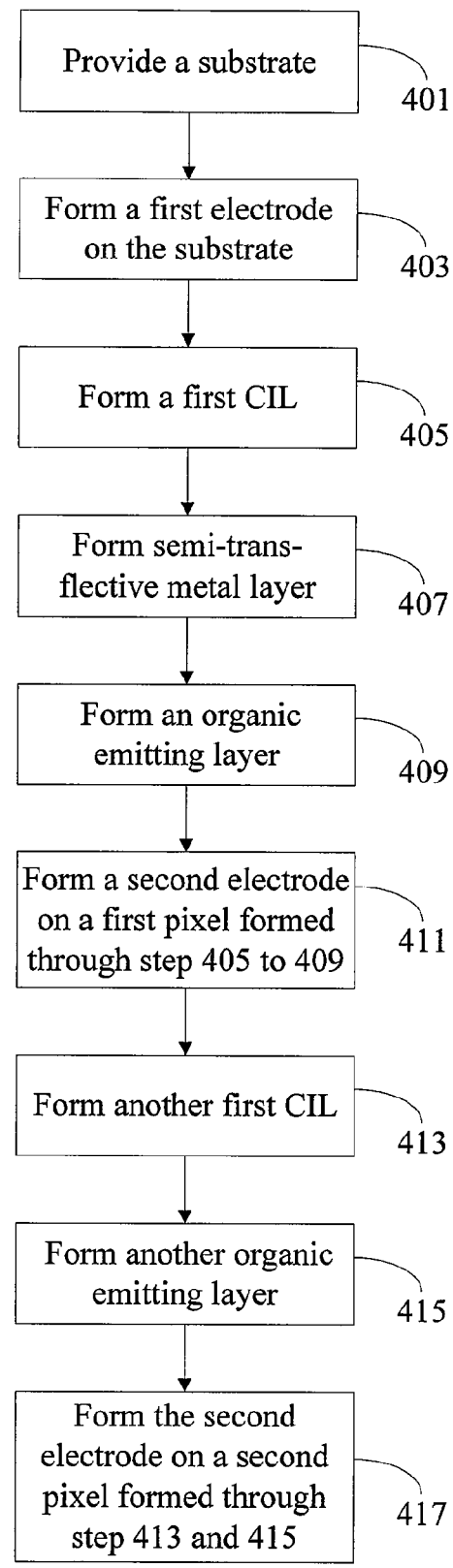
FIG. 4 is a flow chart illustrating the second embodiment of this invention.

As shown in FIG. 4, the second embodiment of the present invention is a method for manufacturing an OEL device. This OEL device may be the OEL device 3 described in the first embodiment, and this method is described as follows.

In step 401, a substrate is provided. Then, a first electrode is formed on the substrate in step 403, which is followed by step 405 where a first CIL is formed. In step 407, a semi-trans-flective metal layer is formed. Subsequently, an organic emitting layer is formed in step 409, which combines with steps 405 and 407 to form a first pixel. In step 411, a second electrode is formed on the first pixel formed through step 405 to 409. Then step 403 is repeated to form another first electrode on the substrate, which is followed by the formation of another CIL in step 413. Thereafter, another organic emitting layer is formed in step 415, which combines with step 413 to form a second pixel. Finally in step 417, the second electrode is formed on the second pixel formed through steps 413 and 415. The process proceeds by repeating in this way. As with the first embodiment, at least one of the first electrodes and the second electrodes formed in the second embodiment is a transparent electrode.

The position where the semi-trans-flective metal layer of the first pixel is formed is not limited in this invention, and it can be formed instead on the first pixel, between the first CIL and the organic emitting layer, or on the organic emitting layer, all of which can be effective in improving the color saturation and luminescent efficiency of the OEL device.

In addition to the first and the second pixel formed through the aforesaid steps, in the method for the second embodiment, additional pixels can also be formed through the same steps.

In addition to the steps depicted in FIG. 4, the second embodiment can also execute all the operations of the first embodiment. Those skilled in the art can understand the corresponding steps and operations of the second embodiment by following the descriptions of the first embodiment, and thus no unnecessary details are given.

It follows from the above description that, as compared to the conventional OEL device with a microcavity structure, the OEL device of this invention can be formed with a semi-trans-flective metal layer and/or a CIL in the individual OEL pixels that the OEL device comprises, and the CIL can be adjusted in the vertical dimension (i.e. the thickness). These properties can effectively improve the luminescent efficiency and the color saturation of the OEL device and effectively mitigate the current leakage therein without introducing any additional process or modifying the existing manufacturing process and yield, thus achieving the goal of technical advancement.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An organic electroluminescence (OEL) pixel, comprising:
a substrate;
a first electrode being formed on the substrate;
a first carrier-injection layer (CIL);
a semi-trans-flective metal layer;
an organic emitting layer; and
a second electrode;
wherein the first CIL, the semi-trans-flective metal layer, and the organic emitting layer are formed between the first electrode and the second electrode, at least one of the first electrode and the second electrode comprises a transparent electrode.

2. The OEL pixel of claim 1, wherein the organic emitting layer comprising:
   a second CIL; and
   a carrier-transport layer (CTL) being formed on the second CIL.

3. The OEL pixel of claim 2, wherein the semi-trans-flective metal layer is formed between the first CIL and the second CIL.

4. The OEL pixel of claim 2, wherein the semi-trans-flective metal layer is formed between the second CIL and the CTL.

5. The OEL pixel of claim 2, wherein the semi-trans-flective metal layer is formed inside the second CIL.

6. The OEL pixel of claim 2, wherein the semi-trans-flective metal layer is formed inside the CTL.

7. The OEL pixel of claim 2, wherein the semi-trans-flective metal layer is formed on the CTL.

8. The OEL pixel of claim 1, wherein the semi-trans-flective metal layer is formed inside the first CIL.

9. The OEL pixel of claim 1, wherein the semi-trans-flective metal layer is formed between the first CIL and the first electrode.

10. The OEL pixel of claim 1, wherein the semi-trans-flective metal layer comprising:
    a pixel range area, wherein a crabwise dimension of the pixel range area is substantially smaller than a crabwise dimension of the semi-trans-flective metal layer; and
    a boundary area being located in the OEL pixel and out of the pixel range area;
    wherein a maximum brightness of the boundary area is substantially smaller than or substantially equal to a half of a maximum brightness of the pixel range area.

11. An organic electroluminescence (OEL) device, comprising:
    a substrate; and
    a plurality of OEL pixels being electrically connected with each other and formed on the substrate, each of the OEL pixels comprising:
    a first electrode being formed on the substrate;
    a first carrier-injection layer (CIL);
    an organic emitting layer; and
    a second electrode;
    wherein at least one of the OEL pixels comprises a semi-trans-flective metal layer, the first CIL, the semi-trans-flective metal layer, and the organic emitting layer are formed between the first electrode and the second electrode, at least one of the first electrode and the second electrode comprises a transparent electrode.

12. The OEL device of claim 11, wherein the organic emitting layer comprising:
    a second CIL; and
    a carrier-transport layer (CTL) being formed on the second CIL.

13. The OEL device of claim 12, wherein the semi-trans-flective metal layer is formed between the first CIL and the second CIL.

14. The OEL device of claim 12, wherein the semi-trans-flective metal layer is formed between the second CIL and the CTL.

15. The OEL device of claim 12, wherein the semi-trans-flective metal layer is formed inside the second CIL.

16. The OEL device of claim 12, wherein the semi-trans-flective metal layer is formed inside the CTL.

17. The OEL device of claim 12, wherein the semi-trans-flective metal layer is formed on the CTL.

18. The OEL device of claim 11, wherein the semi-trans-flective metal layer is formed inside the first CIL.

19. The OEL device of claim 11, wherein the semi-trans-flective metal layer is formed between the first CIL and the first electrode.

20. The OEL device of claim 11, wherein the semi-trans-flective metal layer comprising:
    a pixel range area, wherein a crabwise dimension of the pixel range area is substantially smaller than a crabwise dimension of the semi-trans-flective metal layer; and
    a boundary area being located in the OEL pixel and out of the pixel range area of the OEL pixel;
    wherein a maximum brightness of the boundary area is substantially smaller than or substantially equal to a half of a maximum brightness of the pixel range area.

21. The OEL device of claim 11, wherein the first CIL has a thickness being related to luminescence efficiency of the OEL pixel.

* * * * *